(12) United States Patent
Lee et al.

(10) Patent No.: US 10,964,687 B2
(45) Date of Patent: Mar. 30, 2021

(54) FINFET ESD DEVICE WITH SCHOTTKY DIODE

(71) Applicant: GLOBALFOUNDRIES U.S. Inc., Santa Clara, CA (US)

(72) Inventors: Chien-Hsin Lee, Malta, NY (US); Mahadeva Iyer Natarajan, Clifton Park, NY (US); Manjunatha Prahbu, Clifton Park, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 682 days.

(21) Appl. No.: 15/427,128

(22) Filed: Feb. 8, 2017

(65) Prior Publication Data

US 2018/0226394 A1 Aug. 9, 2018

(51) Int. Cl.
| | |
|---|---|
| *H01L 27/02* | (2006.01) |
| *H01L 29/87* | (2006.01) |
| *H01L 23/535* | (2006.01) |
| *H01L 29/06* | (2006.01) |
| *H01L 29/78* | (2006.01) |

(52) U.S. Cl.
CPC ........ *H01L 27/0262* (2013.01); *H01L 23/535* (2013.01); *H01L 29/0649* (2013.01); *H01L 29/87* (2013.01); *H01L 29/785* (2013.01)

(58) Field of Classification Search
CPC .................................................. H01L 21/0302
See application file for complete search history.

(56) References Cited

U.S. PATENT DOCUMENTS

| | | | |
|---|---|---|---|
| 6,657,276 B1 | 12/2003 | Karlsson et al. | |
| 2008/0067587 A1 | 3/2008 | Gossner et al. | |
| 2015/0054027 A1 | 2/2015 | Clark, Jr. et al. | |
| 2015/0123184 A1* | 5/2015 | Wang | H01L 27/0925 257/315 |
| 2016/0020277 A1 | 1/2016 | Singh et al. | |
| 2016/0300827 A1* | 10/2016 | Vendt | H01L 27/0262 |
| 2017/0323942 A1* | 11/2017 | Voldman | H01L 29/1083 |

FOREIGN PATENT DOCUMENTS

TW    201419490 A    5/2014

OTHER PUBLICATIONS

TW Office Action and English Translation thereof for Taiwanese Patent Application No. 106128427 dated Jun. 22, 2018, 6 pages.

* cited by examiner

*Primary Examiner* — Kenneth Parker
*Assistant Examiner* — Christopher A Culbert
(74) *Attorney, Agent, or Firm* — Francois Pagette; Hoffman Warnick LLC

(57) ABSTRACT

A fin field effect transistor (FinFET) ESD device is disclosed. The device may include: a substrate; a silicon-controlled rectifier (SCR) over the substrate, the SCR including: a p-well region over the substrate; an n-well region laterally abutting the p-well region over the substrate; a first P+ doped region over the p-well region; a first N+ doped region over the p-well region; and a second N+ doped region over the p-well region; and a Schottky diode electrically coupled to the n-well region, wherein the Schottky diode spans the n-well region and the p-well region, and wherein the Schottky diode controls electrostatic discharge (ESD) between the second N+ doped region and the n-well region.

20 Claims, 4 Drawing Sheets

FINFET ESD DEVICE WITH SCHOTTKY DIODE

BACKGROUND

The subject matter disclosed herein relates to integrated circuit devices. More particularly, the subject matter relates to circuits for managing electrostatic discharge (ESD) in fin-type field effect transistor (FinFET) structures.

As integrated circuit technology has evolved, circuit devices, including process-technology used to make those devices, has become ever smaller. Crowding of circuitry in these advanced devices increases the incidence of ESD, or the discharge of static electricity from a body surface to a device. ESD concerns are relevant to both manufacturing processes used in forming integrated circuit devices, as well as in the end-user environment, where haptics have increased the level of interaction between users and devices.

SUMMARY

A first aspect includes a fin field effect transistor (FinFET) electrostatic discharge (ESD) device, the device comprising: a substrate; a silicon-controlled rectifier (SCR) over the substrate, the SCR including: a p-well region over the substrate, an n-well region laterally abutting the p-well region over the substrate, a first P+ doped region over the p-well region, and a first N+ doped region over the p-well region, a second N+ doped region over the p-well region; and a Schottky diode electrically coupled to the n-well region, wherein the Schottky diode spans the n-well region and the p-well region, and wherein the Schottky diode controls electrostatic discharge (ESD) between the second N+ doped region and the n-well region.

A second aspect relates to a fin field effect transistor (FinFET) electrostatic discharge (ESD) device, comprising: a substrate including a p-well region and an n-well region, wherein the p-well region is adjacent to the n-well region; a Schottky diode above and electrically coupled to the n-well region to form a silicon controlled rectifier (SCR) including: a P+ doped region forming a well tap within the p-well region, a first N+ doped region forming a drain within the p-well region, a second N+ doped region forming a source, and wherein the Schottky diode is electrically coupled to the n-well region and spans the n-well region and the p-well region, and wherein the Schottky diode controls electrostatic discharge (ESD) between the second N+ doped region and the n-well region.

A third aspect relates to a fin field effect transistor (FinFET) electrostatic discharge (ESD) device, comprising: a substrate including a p-well region and an n-well region, wherein the p-well region is adjacent to the n-well region, and wherein the n-well region contains a drain; a Schottky diode laterally abutting the drain of the n-well region, the Schottky diode electrically coupled with the n-well region to form a silicon controlled rectifier (ISCR) including: a P+ doped region forming a well tap within the p-well region, a first N+ doped region forming a source within the p-well region, a second N+ doped region forming a drain, and wherein the Schottky diode is electrically coupled to the n-well region and spans the n-well region and the p-well region, and wherein the Schottky diode controls electrostatic discharge (ESD) between the second N+ doped region and the n-well region.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure.

Figure 1:
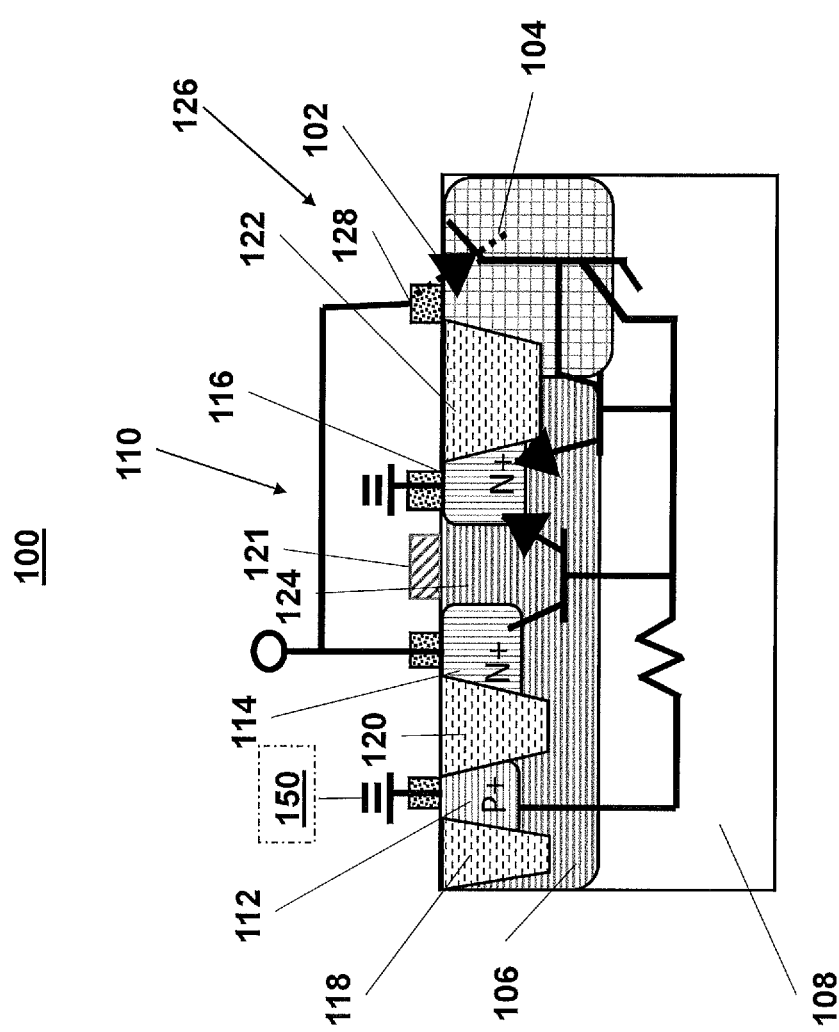
FIG. 1 shows a cross-sectional view of an IC structure with a FinFET device according to embodiments of this disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative. It is understood that the various process steps discussed herein can be implemented in the same manner and/or with slight modifications for semiconductor elements embodied in forms other than a silicon layer. Further, semiconductor elements may be a remaining portion of a single semiconductor-on-insulator (SOI) substrate composed of a layer of semiconductor material bonded to and positioned over a buried insulator layer, as described elsewhere.

As noted herein, the conventional structures for reducing ESD voltage levels have been insufficient. Embodiments of the disclosure include a device with one or more Schottky diodes to protect ESD nodes from voltages that exceed a tolerance level of a device. Schottky diodes (also known as "Schottky barrier diodes") are formed at a junction between a metal and a semiconductor material. The position of the metal directly adjacent to the semiconductor material can allow a depletion region to form at the boundary surface during operation of a device. The current-voltage properties of the Schottky diode depend upon the polarity of the applied voltage. As used herein, 'well taps' are used to prevent latch-up and positioned in the integrated circuit appropriate distances from one another. Each well tap is an electrically conductive lead that couples a well region of the integrated circuit to a power source and each substrate tap is an electrically conductive lead that couples a substrate region of the integrated circuit to ground. Coupling the well and substrate regions to power and ground, respectively, reduces the substrate resistance, thus causing the positive feedback to be removed. Additionally used herein, an ohmic contact, or an 'ohmic contact trench' is defined as one in which there is an unimpeded transfer of majority carriers from one material to another, i.e., the contacts do not limit the current. The way to achieve such a contact is by doping the semiconductor heavily enough that tunneling is possible.

Forming one or more devices according to the present disclosure can include forming a p-well and an n-well directly laterally adjacent to each other on a semiconductor substrate. As shown in FIG. 1, the p-well can be segmented by three isolation trenches 118, 120, 122 therein. The p-well region can include a P+ doped region 112 in between a first and second trenches 118, 120, a first N+ doped region on an adjacent side of second trench 120 and a second N+ doped region 116 on an opposing side of gate 121 next to a third trench 122. These structures can thereby define a Schottky diode 102 within the finFET structure, such that Schottky diode 102 is formed without using any additional process masks, e.g., as may be needed in conventional structures. A power clamp 150 (shown in phantom) may be optionally utilized in conjunction with embodiments of this disclosure. As understood in the art, a power clamp 150 is an electronic circuit that fixes either the positive or the negative peak excursions of a signal to a defined value by shifting its DC value, and the overall structure of a general clamp circuit consists of three parts: the clamp device, the delay element and the detect element. The P-N-P-N switch of SCR can include (p-type) substrate 112, n-well region 104, p-well region 106, and negatively charged gate 121.

FIG. 1 particularly shows a cross-sectional view of a FinFET electrostatic discharge (ESD) device (simply "device" hereafter) 100 according to one embodiment of the present disclosure. Device 100 includes a semiconductor substrate 108, which may be composed of bulk or doped silicon underlying a p-well region 106 adjacent to an n-well region 104. Semiconductor substrate 108 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+ X2+ X3+ Y1+ Y2+ Y3+ Y4=1 (1 being the total relative mole quantity).

Further referring to FIG. 1, p-well region 106 can be positively doped, e.g., with ions of boron and/or $BF_2$ (boron-fluorine). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate 108 may be strained. A fin 124 is shown in a center of FinFET ESD device 100.

As noted, device 100 can also include a Schottky diode 102. Schottky diode 102 is formed laterally abutting n-well region 104, and is formed through the junction between a metal area and semiconductor substrate 108. A metal contact 125 forms the metal area in this embodiment and may electrically connect to n-well region 104. Schottky diode 102 is electrically coupled with a source side 126 of the FinFET ESD device to a silicon-controlled rectifier (SCR) that possesses an extra terminal at contact 125 as an anode to apply a latching voltage to be turned on. Metal contact 125 may include metal such as but not limited to: molybdenum, platinum, chromium or tungsten, and may include certain silicides (e.g., palladium silicide and platinum silicide). To act as an anode region of Schottky diode 102, n-well region 104 can be negatively doped, e.g., with ions of arsenic and/or phosphorus. This n-well region 104 is on source side 126 of device 110, i.e., NMOS FinFET.

The SCR of device 100 can also include a P+ doped region 112 forming a well tap to give a reverse bias to n-well region 104 and p-well region 106 to avoid latch-up. Device 100 can also include a first fin N+ doped region 114 acting as a drain region and a second N+ doped region 116 acting as a source region, adjacent to a gate 124 (fin) formed above p-well region 106 between first N+ doped region 114 and a second N+ doped region 116. Device 100 can include a shallow isolation trench 118 laterally abutting P+ doped region 112, which also laterally abuts isolation trench 120. Isolation trench 122 is adjacent to the second N+ doped region 116 and n-well region 104. Optional power clamp 150 may be electrically coupled to P+ doped region 112 to fix either the positive or the negative peak excursions of a signal to a defined value by shifting its DC value.

Figure 2:
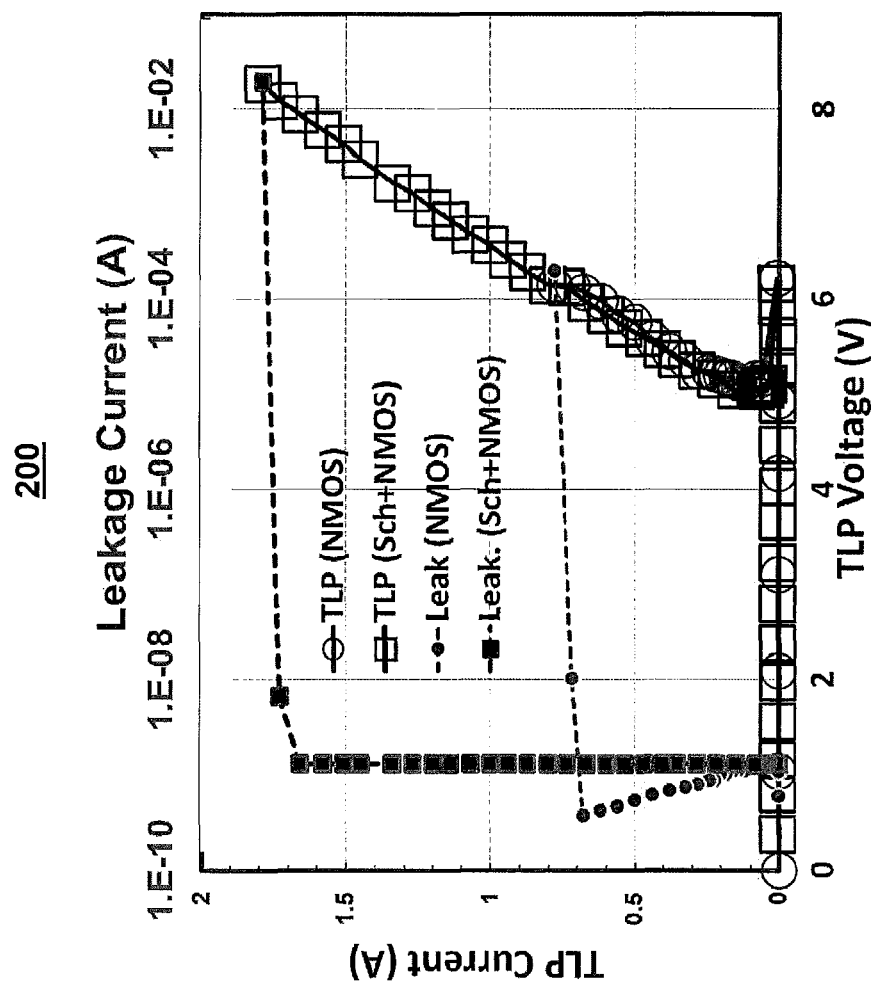
FIG. 2 shows a chart depicting a FinFET device's current versus voltage according to embodiments of this disclosure.

Referring to FIG. 2, a chart comparison 200 depicting a PNPN switch's general transmission-line pulse (TLP) current versus voltage according to embodiments of the present disclosure is shown. A test TLP of 100 nanoseconds (ns) was used to test device 100 reactions to simulated ESD events. The comparison chart 200 illustrates a comparison of TLP current-voltage (IV) between a conventional NMOS device, and an NMOS device utilizing a Schottky diode as the functional ISCR according to embodiments of the disclosure. The ISCR can be seen to show less drift, and less current leakage in their operational characteristics, indicating less device damage and a higher damage threshold of approximately 1.7 Amps (A) compared to 0.7 A in the conventional devices.

Figure 3:
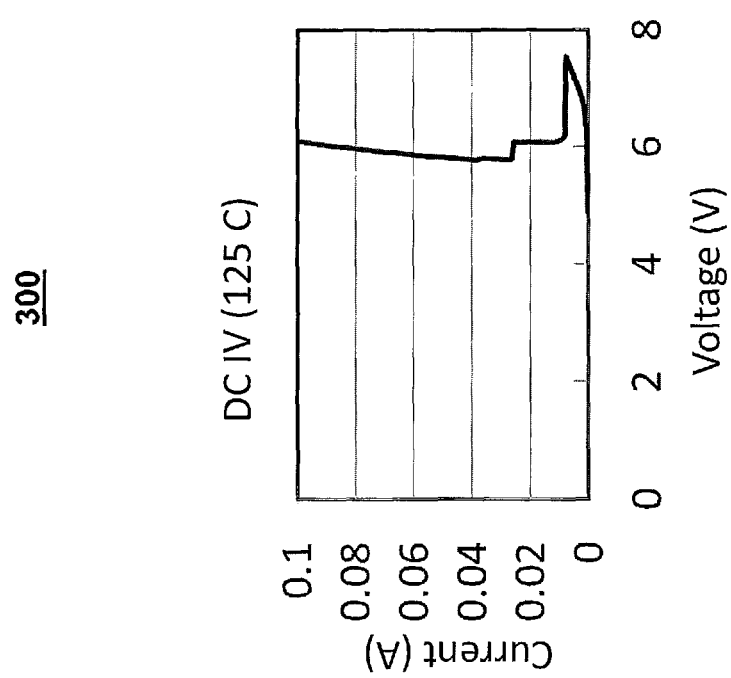
FIG. 3 shows a chart depicting a FinFET device's current versus voltage according to embodiments of this disclosure.

Referring to FIG. 3, a chart 300 depicting an ISCR general current versus voltage characteristics according to alternate embodiments of the present disclosure is shown. Chart 300 shows the direct current (DC) characteristics of a NMOS device with a Schottky diode according to embodiments of the disclosure during the TLP current-voltage test as referenced in FIG. 2. Chart 300 show a high holding voltage (i.e., >5.5 Volts (V)) at an operating temperature of approximately 125° C. As shown, the ISCR does not have any latch-up risk for the chip operated at the voltage below 5V.

Figure 4:
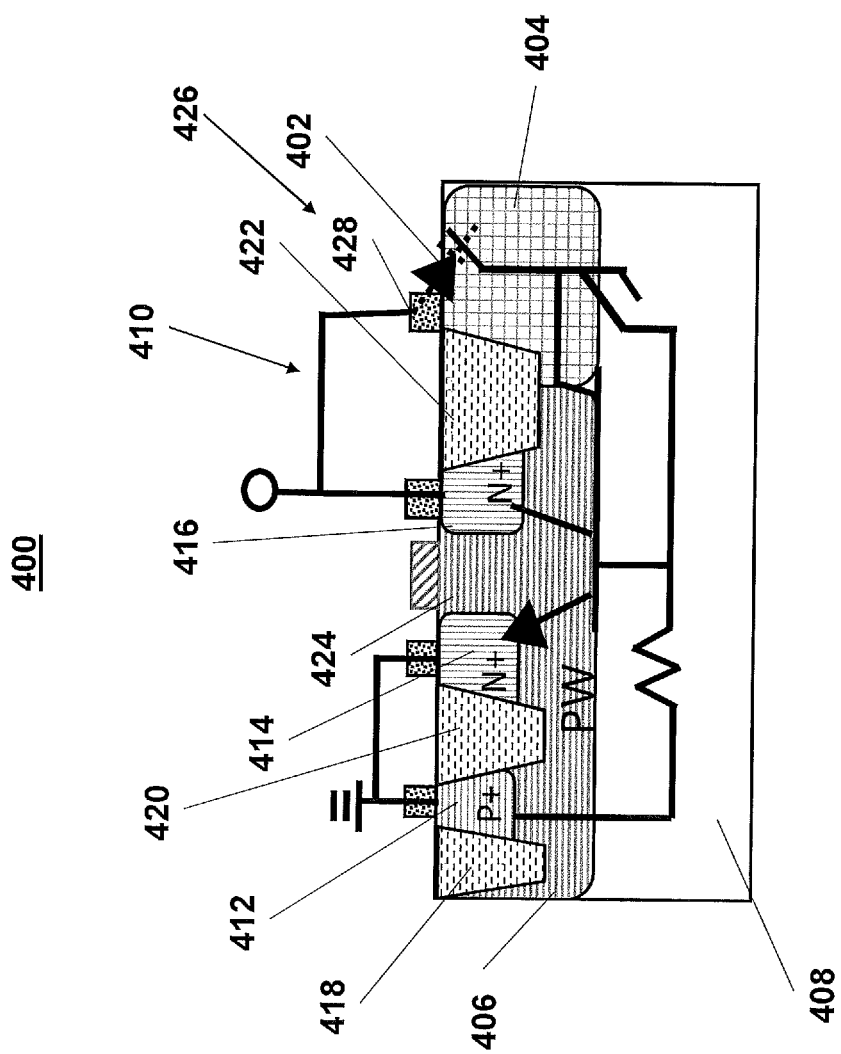
FIG. 4 shows a cross-sectional view of an IC structure with a FinFET device according to embodiments of this disclosure.

Referring to FIG. 4, a FinFET EDS device 400, which also includes a Schottky diode 402 according to an alternative embodiment of the disclosure, is illustrated. In this embodiment, Schottky diode 402 includes a metal contact 425 laterally abutting an n-well region 404, and is formed through the junction between the metal and the semiconductor substrate. N-well region 404 is electrically coupled with a drain side 426 of FinFET device 410 to act as a SCR that possesses an extra terminal at metal contact 424 as an anode to apply a latching voltage to be turned on. Metal contact 424 can include a metal such as molybdenum, platinum, chromium or tungsten, and/or certain silicides (e.g., palladium silicide and platinum silicide). N-well region 404 may be doped, e.g., with arsenic and/or phosphorous, to act as an anode region of Schottky diode 402. N-well region 404 is on a drain side 426 of FinFET device 410.

Device 400 can also include a P+ doped region 412 forming a well tap to give a reverse bias to n-well region 404 and p-well region 406 to avoid latchup. Device 400 can also include a first N+ doped region 416 acting as a drain, and a second N+ doped region 414 acting as a source region adjacent to a gate 424 (fin) formed above p-well region 406. Gate 424 is positioned between a first N+ doped region 414 and a second N+ doped region 416. Device 400 can also include shallow isolation trench 418 laterally abutting P+ doped region 412, which in turn can laterally abut an isolation trench 420. Isolation trench 420 is positioned between second N+ doped region 414 and P+ doped region 412, and isolation trench 422 is positioned between N+ dope region 416 and n-well region 404.

The terminology used herein is for the purpose of describing particular example embodiments only and is not intended to be limiting. As used herein, the singular forms "a," "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

Spatially relative terms, such as "inner," "outer," "beneath," "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to an individual in the art are included within the scope of the disclosure as defined by the accompanying claims.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A fin field effect transistor (FinFET) electrostatic discharge (ESD) device, the device comprising:
    a substrate; and
    a silicon-controlled rectifier (SCR) over the substrate, the SCR including:
        a p-well region over the substrate,
        an n-well region directly laterally abutting the p-well region over the substrate, wherein the n-well region is free of N+ type or P+ type doped regions therein,
        a first P+ doped region over the p-well region,
        a first N+ doped region over the p-well region,
        a second N+ doped region over the p-well region,
        a metal contact directly on an upper surface of the n-well region, and
        a Schottky diode formed in the n-well region, wherein the Schottky diode spans the metal contact, the n-well region, and the p-well region, and wherein the Schottky diode controls electrostatic discharge (ESD) between the second N+ doped region and the n-well region.

2. The device of claim 1, wherein the Schottky diode includes a metal-semiconductor material.

3. The device of claim 1, wherein the substrate is p-type doped.

4. The device of claim 1, wherein the substrate is bulk silicon.

5. The device of claim 1, wherein the SCR includes a PNPN switch.

6. The device of claim 5, wherein the PNPN switch with the first P+ doped region is maintained at a positive potential in respect to the second N+ doped region.

7. The device of claim 1, wherein the SCR further includes a drain, and wherein the Schottky diode laterally abuts the drain of the SCR.

8. The device of claim 1, further comprising additional sets of N+ doped regions and P+ doped regions over each of a plurality of p-well regions and a plurality of n-well regions.

9. A fin field effect transistor (FinFET) electrostatic discharge (ESD) device, the device comprising:
    a substrate including a p-well region and an n-well region, wherein the p-well region is directly adjacent to the n-well region, and wherein the n-well region is free of N+ type or P+ type doped regions therein;
    a metal contact directly on an upper surface of the n-well region; and
    a Schottky diode above and electrically coupled to the n-well region to form a silicon controlled rectifier (SCR) including:
        a P+ doped region forming a well tap within the p-well region,
        a first N+ doped region forming a drain within the p-well region,
        a second N+ doped region forming a source, and
    wherein the Schottky diode is electrically coupled to the n-well region and spans the metal contact, the n-well region, and the p-well region, and wherein the Schottky diode controls electrostatic discharge (ESD) between the second N+ doped region and the n-well region.

10. The device of claim 9, further comprising a set of insulating regions about at least one of a device isolation trench and an ohmic contact trench abutting the P+ doped region and the first N+ doped region.

11. The device of claim 10, further comprising each of the device isolation trench abutting the P+ doped region and the first N+ doped region, wherein the device isolation trench and the ohmic contact trench are of different sizes.

12. The device of claim 9, wherein the SCR includes a PNPN switch, and wherein the PNPN switch with the P+ doped layer is maintained at a positive potential in respect to the second N+ doped layer.

13. The device of claim 9, wherein the Schottky diode includes a metal-semiconductor material.

14. The device of claim 9, further comprising a power clamp electrically coupled to the source.

15. A fin field effect transistor (FinFET) electrostatic discharge (ESD) device, the device comprising:
   a substrate including a p-well region and an n-well region, wherein the p-well region is directly adjacent to the n-well region, and wherein the n-well region is free of N+ type or P+ type doped regions therein;
   a metal contact directly on an upper surface of the n-well region; and
   a Schottky diode above and electrically coupled to the n-well region to form a silicon controlled rectifier (SCR) including:
      a first P+ doped region over the p-well region,
      a first N+ doped region over the p-well region and electrically coupled to the metal contact, and
      a second N+ doped region over the p-well region, wherein the Schottky diode is electrically coupled to the n-well region and spans the metal contact, the n-well region, and the p-well region, and wherein the Schottky diode controls electrostatic discharge (ESD) between the second N+ doped region and the n-well region; and
   a power clamp electrically coupled to the first P+ doped region.

16. The device of claim 15, wherein the SCR includes a PNPN switch.

17. The device of claim 15, further comprising additional sets of N+ doped regions and P+ doped regions over each of a plurality of p-well regions and a plurality of n-well regions.

18. The device of claim 15, further comprising a set of insulating regions about at least one of a device isolation trench and an ohmic contact trench abutting the P+ doped region and the first N+ doped region.

19. The device of claim 18, further comprising each of the device isolation trench abutting the P+ doped region and the first N+ doped region, wherein the device isolation trench and the ohmic contact trench are of different sizes.

20. The device of claim 16, wherein the power clamp maintains the PNPN switch with the first P+ doped region at a positive potential in respect to the second N+ region.

* * * * *